United States Patent
Fukuda et al.

(10) Patent No.: US 8,283,226 B2
(45) Date of Patent: Oct. 9, 2012

(54) METHOD FOR MANUFACTURING SEMICONDUCTOR DEVICE

(75) Inventors: Masahiro Fukuda, Yokohama (JP);
Yosuke Shimamune, Yokohama (JP);
Yuka Kase, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 100 days.

(21) Appl. No.: 12/690,484

(22) Filed: Jan. 20, 2010

(65) Prior Publication Data

US 2010/0210083 A1    Aug. 19, 2010

(30) Foreign Application Priority Data

Feb. 17, 2009 (JP) ................................. 2009-034259

(51) Int. Cl.
*H01L 21/8238* (2006.01)
(52) U.S. Cl. ................. 438/218; 257/E21.632
(58) Field of Classification Search .................. 438/218, 438/199
See application file for complete search history.

(56) References Cited

U.S. PATENT DOCUMENTS

| 7,291,528 | B2 * | 11/2007 | Chen et al. | 438/199 |
| 2008/0006818 | A1 | 1/2008 | Luo et al. | |
| 2008/0081406 | A1 * | 4/2008 | Choo et al. | 438/199 |
| 2008/0119019 | A1 * | 5/2008 | Han et al. | 438/197 |
| 2009/0029512 | A1 * | 1/2009 | Willer et al. | 438/261 |

FOREIGN PATENT DOCUMENTS

JP    2007-329477 A    12/2007

* cited by examiner

*Primary Examiner* — Charles Garber
*Assistant Examiner* — Reema Patel
(74) *Attorney, Agent, or Firm* — Westerman, Hattori, Daniels & Adrian, LLP

(57) ABSTRACT

A method of manufacturing a semiconductor device includes forming a first cap film over gate electrodes formed in a first active region and a second active region, etching the first cap film over the first active region, forming a second cap film over the gate electrodes formed in the first active region and the second active region, etching the second cap film over the first active region, etching the first active region using the gate electrodes to form concave portions in the first active region, and embedding a semiconductor material in the concave portions.

7 Claims, 17 Drawing Sheets

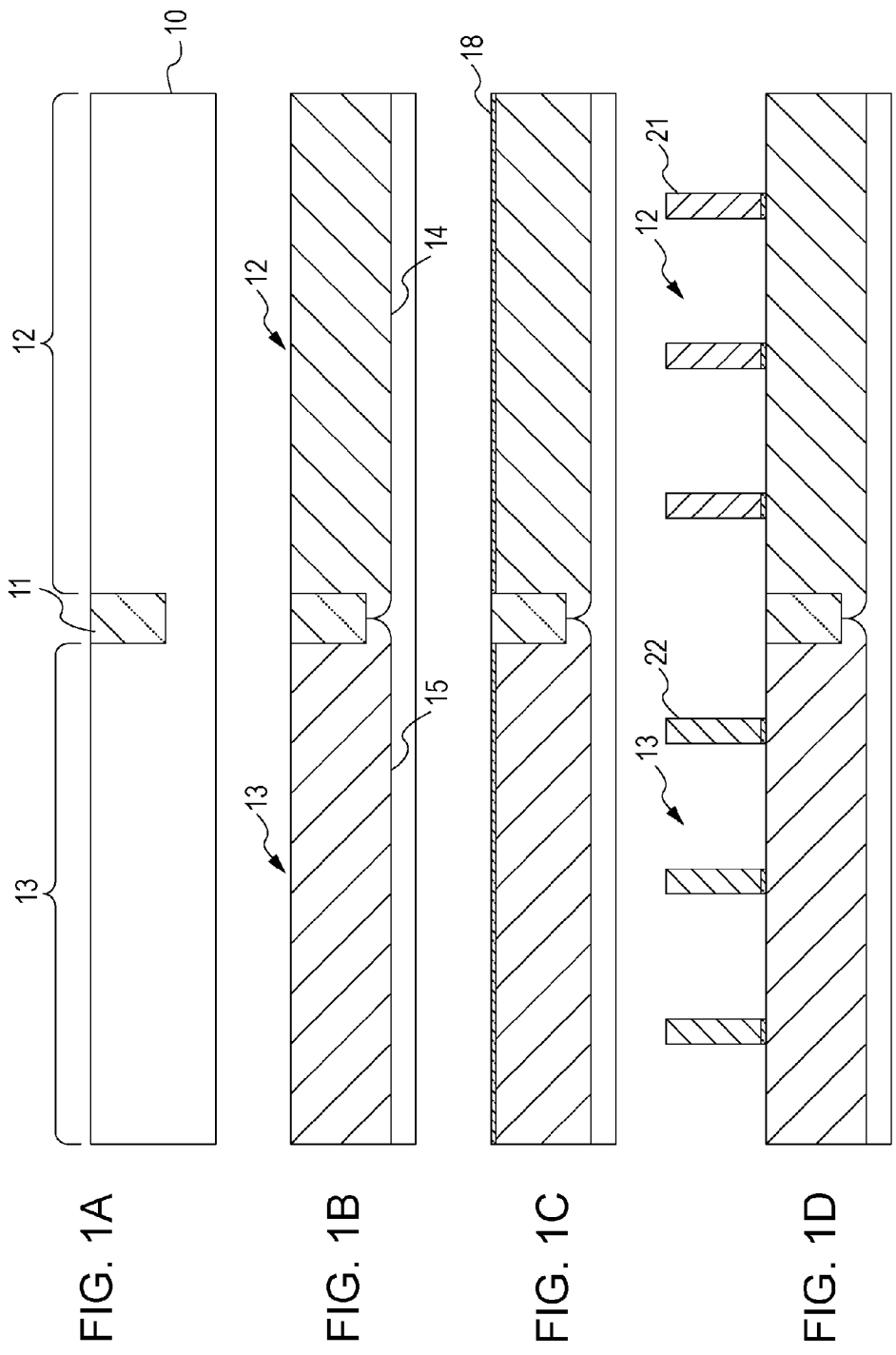

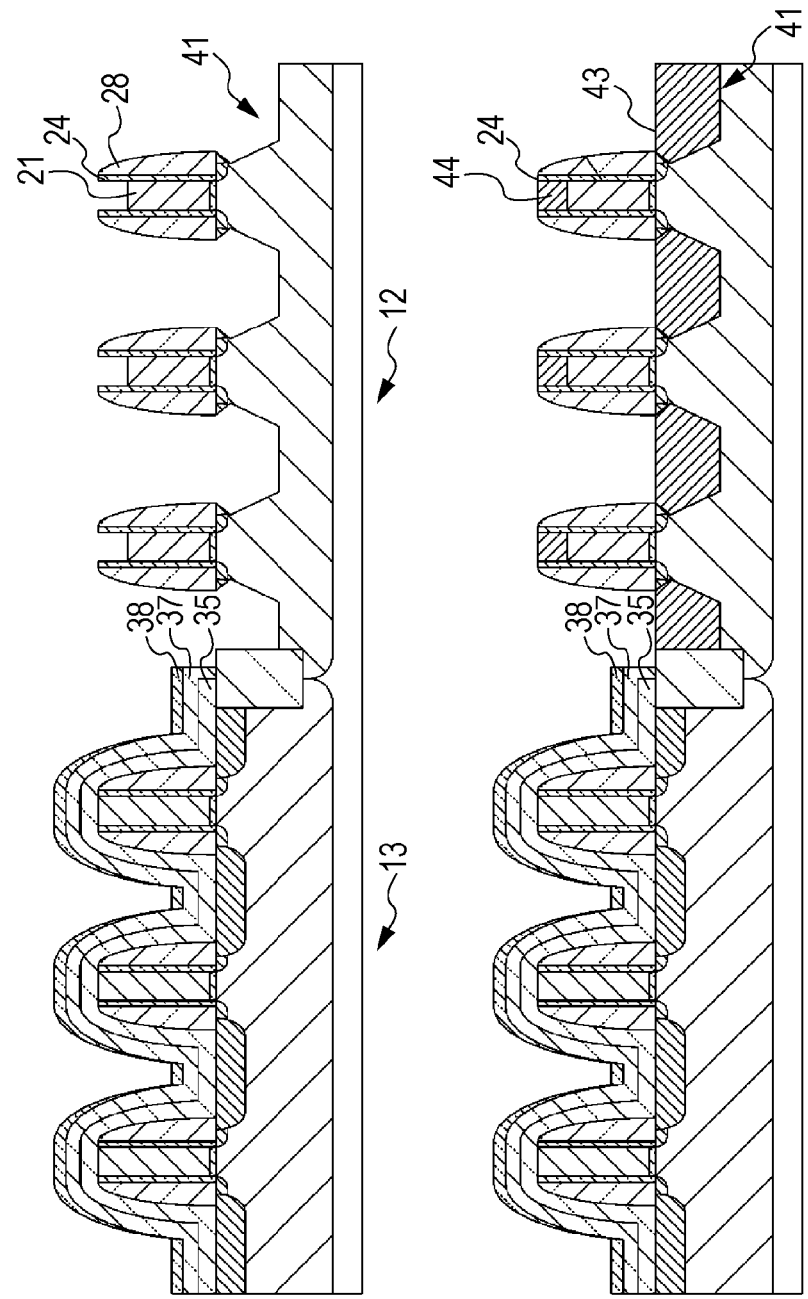

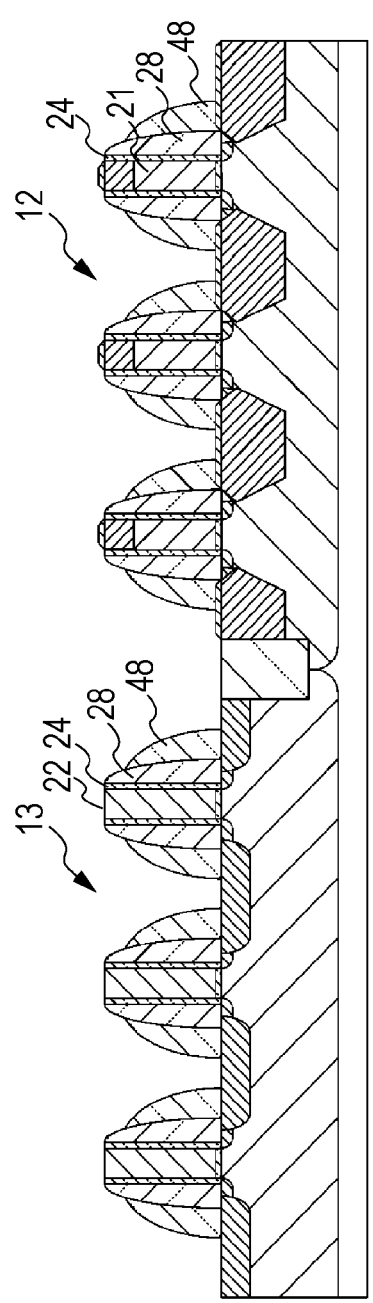
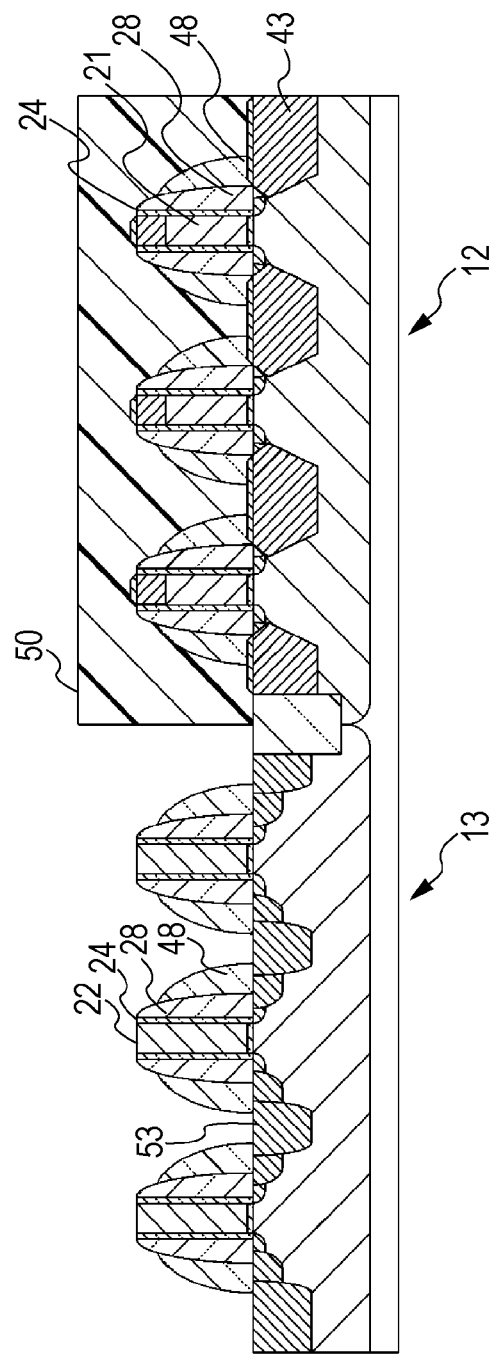
FIG. 1U
FIG. 1V

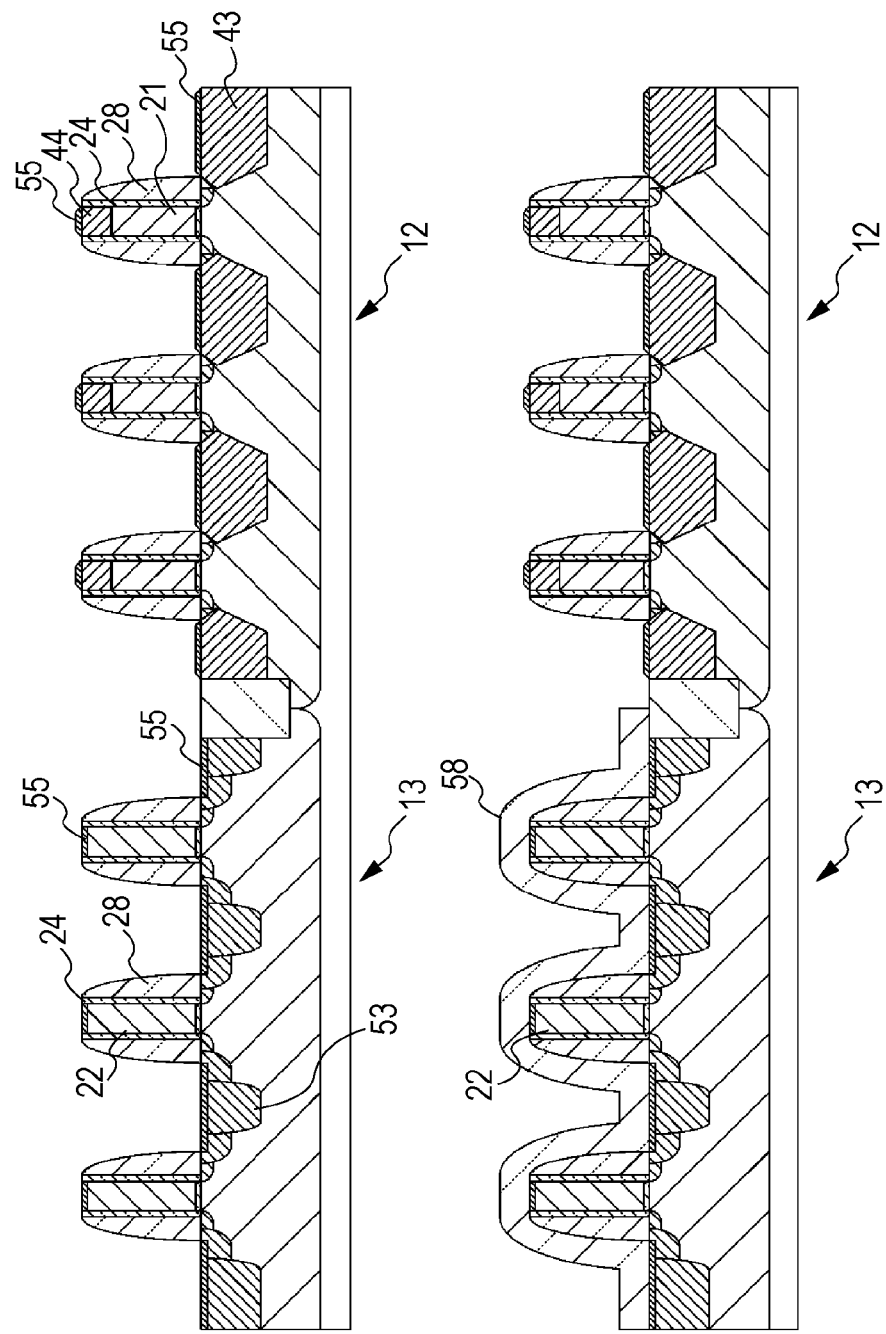

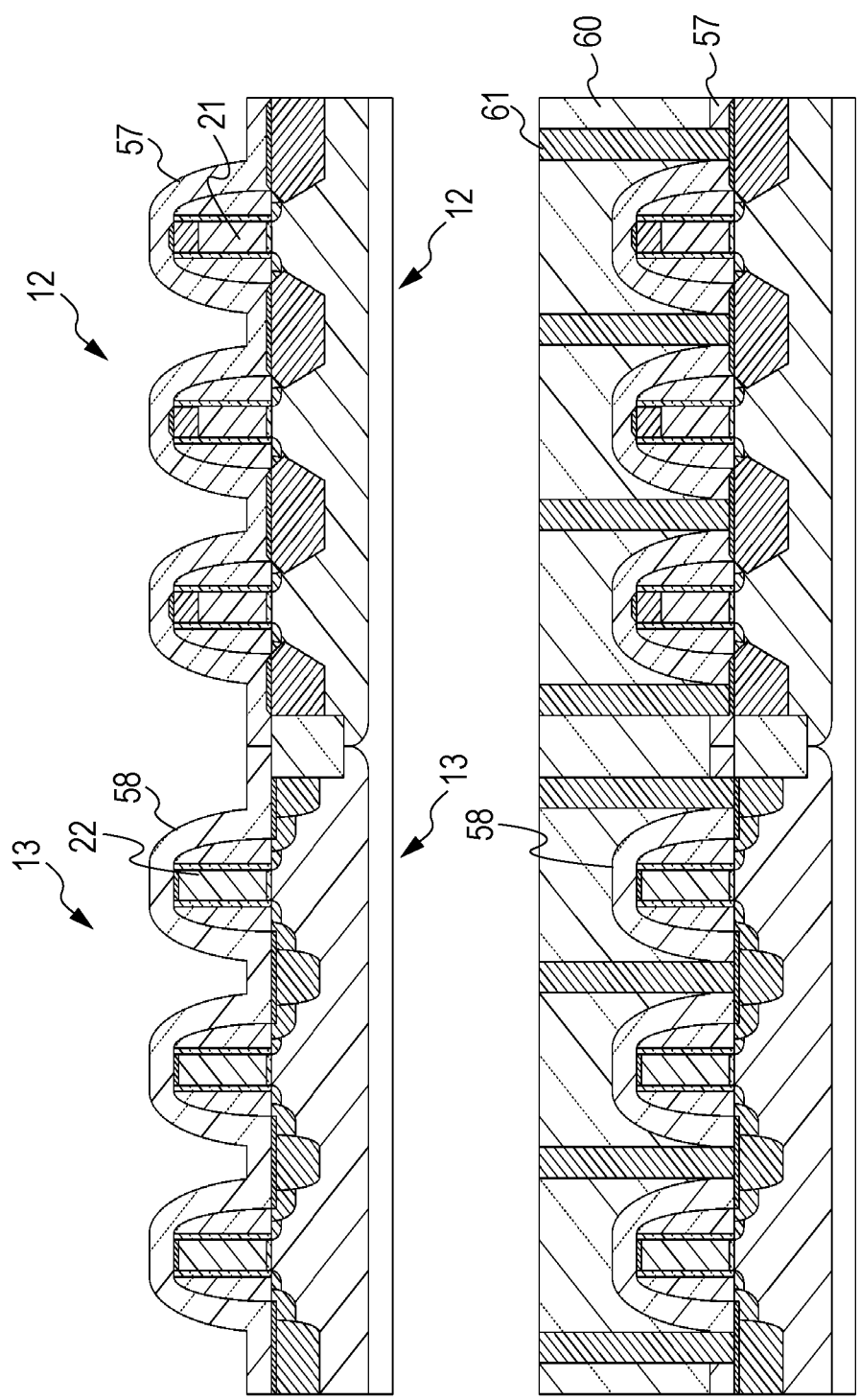

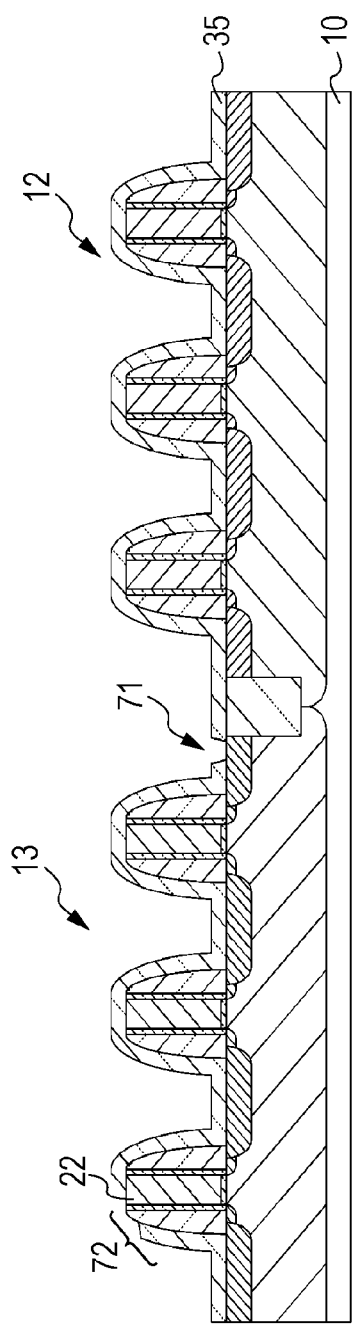
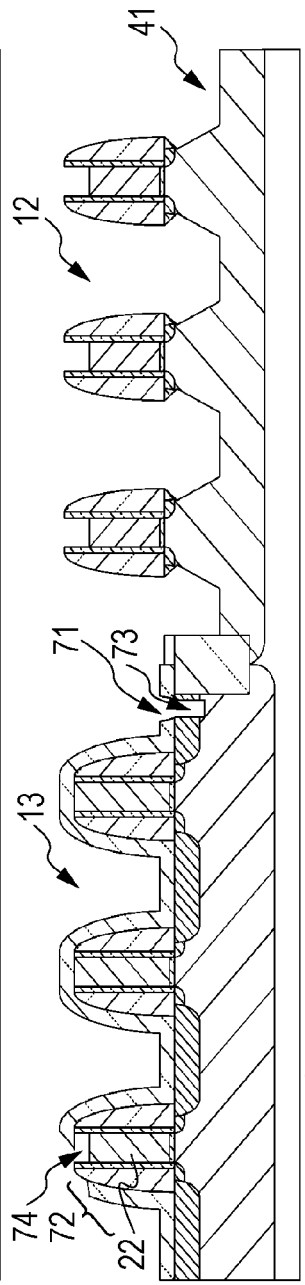
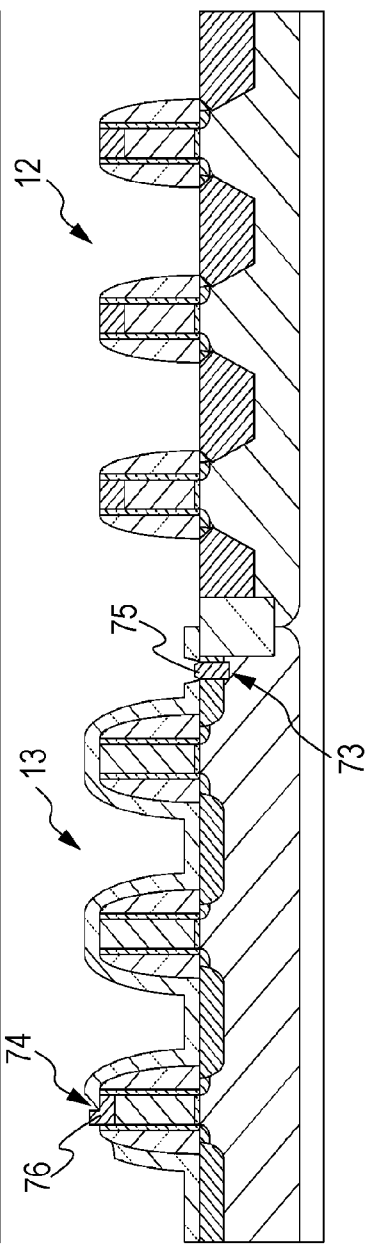
FIG. 2A
FIG. 2B
FIG. 2C

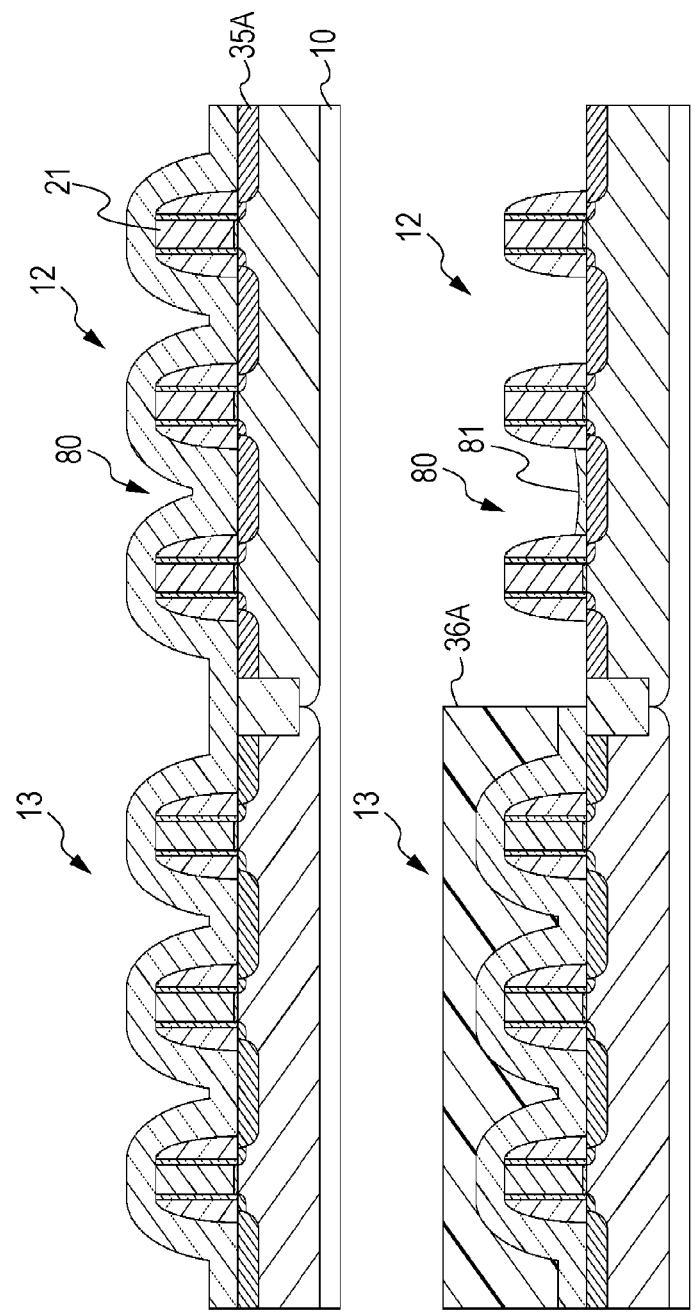

US 8,283,226 B2

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2009-34259, filed on Feb. 17, 2009, the entire contents of which is incorporated herein by reference.

FIELD

The present invention relates to a method for manufacturing a semiconductor device.

BACKGROUND

As one method for increasing an operation speed of a MOSFET, there may be mentioned a method in which a silicon crystal in a channel region is distorted to improve the mobility of carriers. For example, when SiGe is buried in a source and a drain region of a pMOSFET, a compressive stress may be applied to a channel region. As a result, the mobility of holes may be increased.

On the other hand, when SiGe is buried in a source and a drain region of an nMOSFET, the performance thereof is degraded. Hence, it is preferable that SiGe be buried in a source and a drain region of a pMOSFET and not be buried in a source and a drain region of an nMOSFET.

When gate electrodes of a plurality of pMOSFETs are disposed in one active region at a high density, it becomes difficult to bury SiGe in a source and a drain region of each pMOSFET without burying SiGe in a source and a drain region of each nMOSFET.

SUMMARY

According to an aspect of the invention, a method of manufacturing a semiconductor device includes forming a first cap film over gate electrodes formed in a first active region and a second active region, etching the first cap film over the first active region, forming a second cap film over the gate electrodes formed in the first active region and the second active region, etching the second cap film over the first active region, etching the first active region using the gate electrodes to form concave portions in the first active region, and embedding a semiconductor material in the concave portions.

An object and advantages of an embodiment of the invention will be realized and attained by elements and combinations of elements particularly pointed out in the claims. It is to be understood that both the foregoing general description and the following detailed description are explanatory and are not restrictive of the invention, as claimed.

BRIEF DESCRIPTION OF THE DRAWINGS

FIGS. 2A to 2C illustrate method of manufacturing a semiconductor device according to a comparative example 1;
FIGS. 3A to 3C illustrate method of manufacturing a semiconductor device according to a comparative example 2.

DESCRIPTION OF THE PREFERRED EMBODIMENTS

Figure 1E:
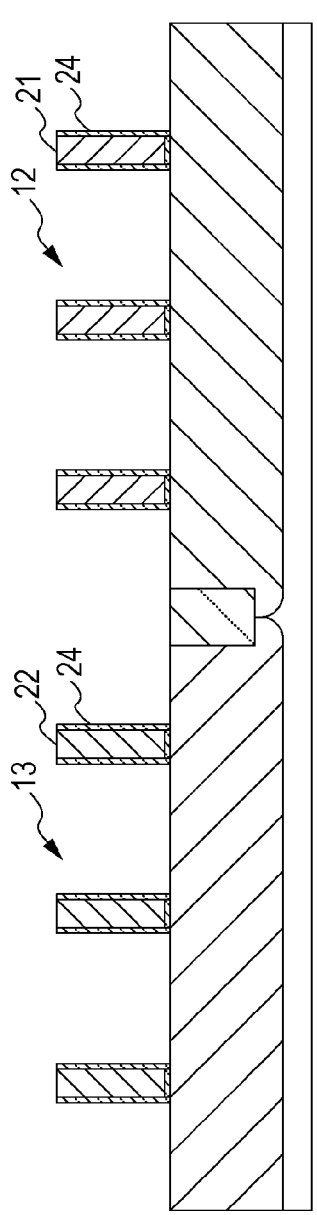
FIGS. 1A to 1Z illustrate method of manufacturing a semiconductor device according to an embodiment.

As illustrated in FIG. 1A, an element isolation insulating film 11 is formed in a semiconductor substrate 10, such as a silicon substrate, by shallow trench isolation (STI) or the like, so that a first active region 12 for pMOSFETs and a second active region 13 for nMOSFETs are defined.

A method for forming the element isolation insulating film 11 will be described. An element isolation groove is formed in the semiconductor substrate 10 by reactive ion etching (RIE). A silicon oxide film is deposited on the semiconductor substrate 10 and in the element isolation groove by plasma enhanced chemical vapor deposition (PECVD). The silicon oxide film on the semiconductor substrate 10 is removed by chemical mechanical polishing (CMP), and silicon oxide is allowed to remain in the element isolation groove. In addition, a structure in which SiN is contained in the element isolation insulating film 11 may also be used.

The first active region 12 is covered with a resist pattern, and a p-type impurity is implanted into the second active region 13, so that a p-type well 15 is formed. In the ion implantation, for example, boron (B) is used as the impurity, the acceleration energy is set to 100 keV, and the dose is set to be in a range from $1\times10^{13}/cm^2$ to $5\times10^{13}/cm^2$.

Channel stop implantation and ion implantation for threshold control may also be performed. In the channel stop implantation, for example, boron (B) is used as the impurity, the acceleration energy is set to 15 keV to 25 keV, and the dose is set to $5\times10^{12}/cm^2$.

In the ion implantation for threshold control, for example, boron (B) is used as the impurity, the acceleration energy is set to 10 keV, and the dose is set to be in a range from $0.5\times10^{13}/cm^2$ to $2\times10^{13}/cm^2$.

After the ion implantations described above are performed, the resist pattern covering the first active region 12 is removed by an ashing treatment or a wet treatment using a mixed solution which contains sulfuric acid and hydrogen peroxide water.

The second active region 13 is covered with a resist pattern, and an n-type impurity is implanted into the first active region 12, so that an n-type well 14 is formed. In the ion implantation, for example, phosphorous (P) is used as the impurity, the acceleration energy is set to 250 keV to 350 keV, and the dose is set to be in a range from $1\times10^{13}/cm^2$ to $5\times10^{13}/cm^2$.

Channel stop implantation and ion implantation for threshold control may also be performed. In the channel stop implantation, for example, arsenic (As) is used as the impurity, the acceleration energy is set to 100 keV to 150 keV, and the dose is set to be in a range from $1\times10^{12}/cm^2$ to $5\times10^{12}/cm^2$.

In the ion implantation for threshold control, for example, arsenic (As) is used as the impurity, the acceleration energy is set to 50 keV to 100 keV, and the dose is set to be in a range from $0.5\times10^{13}/cm^2$ to $2\times10^{13}/cm^2$.

After the ion implantations described above are completed, the resist pattern covering the second active region 13 is removed by an ashing treatment or a wet treatment using a mixed solution which contains sulfuric acid and hydrogen peroxide water.

Furthermore, in order to activate the impurities, for example, spike annealing is performed at 1,000° C. for 10 seconds, so that the structure illustrated in FIG. 1B is formed.

As illustrated in FIG. 1C, the surface of the semiconductor substrate 10 is processed by dry thermal oxidation at approximately 900° C., so that an oxide film having a thickness of approximately 1 nm is formed. This oxide film is processed by a plasma nitridation treatment in an NO atmosphere, an $N_2O$ atmosphere, or an $NH_3$ atmosphere, so that a gate insulating film 18 of silicon oxynitride is formed. For the gate insulating film 18, a high dielectric constant insulating material having a dielectric constant higher than that of silicon oxide or silicon nitride may also be used. In addition, the gate insulating film 18 formed in the first active region 12 may have a different thickness from that of the gate insulating film 18 formed in the second active region 13.

As illustrated in FIG. 1D, a plurality of first gate electrodes 21 is formed on the first active region 12, and a plurality of second gate electrodes 22 is formed on the second active region 13. The first gate electrodes 21 are disposed parallel to each other with intervals therebetween. In the manner similar to that described above, the second gate electrodes 22 are disposed parallel to each other with intervals therebetween.

A method for forming the first gate electrodes 21 and the second gate electrodes 22 will be described. A gate electrode film of polysilicon or the like is formed by low-pressure chemical vapor deposition (LPCVD) on the semiconductor substrate 10 on which the gate insulating film 18 is formed. The thickness of the gate electrode film is set, for example, to 100 nm. A film forming temperature for polysilicon is set, for example, to 600° C. The gate electrode film may also be formed from amorphous silicon.

The gate electrode film on the first active region 12 is covered with a resist pattern, and an n-type impurity is implanted into the gate electrode film on the second active region 13. In the implantation of an n-type impurity, for example, arsenic (As) is used as the impurity, the acceleration energy is set to 20 keV to 30 keV, and the dose is set to be in a range from $3\times10^{15}/cm^2$ to $5\times10^{15}/cm^2$.

After the resist pattern on the first active region 12 is removed, the gate electrode film on the second active region 13 is covered with a resist pattern, and a p-type impurity is implanted into the gate electrode film on the first active region 12. In the implantation of a p-type impurity, for example, boron (B) is used as the impurity, the acceleration energy is set to 3 keV to 5 keV, and the dose is set to be in a range from $3\times10^{15}/cm^2$ to $5\times10^{15}/cm^2$.

After the ion implantation is performed, the resist pattern is removed. In order to promote the diffusion of the impurities implanted into the gate electrode film, a spike annealing may be performed at 1,000° C. for 5 seconds.

After the ion implantations described above are performed, the gate electrode film is patterned, so that the first gate electrodes 21 and the second gate electrodes 22 are formed. Before the resist is applied, an antireflection film may be formed on the gate electrode film. The etching of the gate electrode film is performed, for example, by RIE.

As illustrated in FIG. 1E, first sidewall spacers 24 of silicon oxide or the like are formed on side surfaces of the first gate electrodes 21 and side surfaces of the second gate electrodes 22. The thickness of the silicon oxide film is set, for example, to approximately 10 nm. Hereinafter, a method for forming the first sidewall spacers 24 will be described.

A silicon oxide film having a thickness of approximately 10 nm is formed so as to cover the semiconductor substrate 10, the first gate electrodes 21, and the second gate electrodes 22. This silicon oxide film is formed by LPCVD at a film forming temperature of 600° C. using oxygen ($O_2$) and tetraethyl orthosilicate (TEOS) as source gas. Instead of the silicon oxide film, a silicon nitride film may also be used. For the formation of a silicon nitride film, dichlorosilane ($SiH_2Cl_2$) and ammonia ($NH_3$) are used as starting materials, and the film forming temperature is set to 650° C.

Anisotropic etching is performed on this silicon oxide film to remove the silicon film on the flat surfaces, so that the first sidewall spacers 24 made of silicon oxide are allowed to remain on the side surfaces of the first gate electrodes 21 and the side surfaces of the second gate electrodes 22.

Figure 1F:
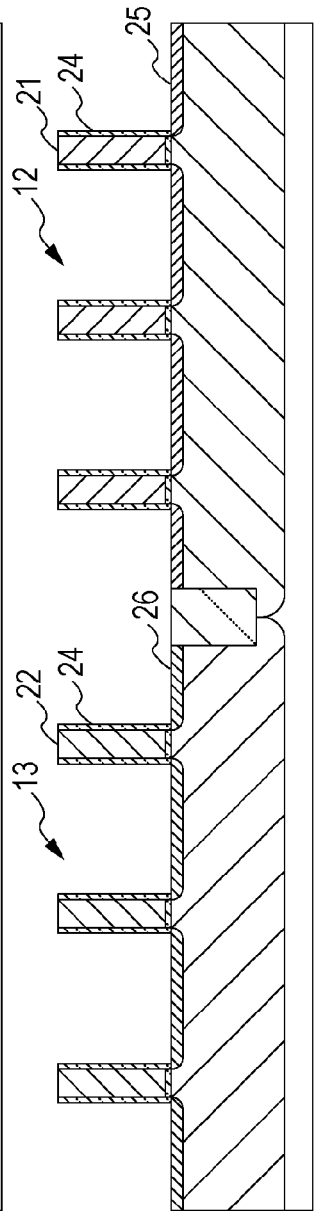

As illustrated in FIG. 1F, the first active region 12 is covered with a resist pattern, and an n-type impurity is implanted into the second active region 13 using the second gate electrodes 22 and the first sidewall spacers 24 as masks, so that extension regions 26 are formed. In the implantation of an n-type impurity, for example, arsenic (As) is used as the impurity, the acceleration energy is set to 1 keV to 3 keV, and the dose is set to be in a range from $1\times10^{15}/cm^2$ to $2\times10^{15}/cm^2$.

Furthermore, a p-type impurity is implanted to form pocket regions (not illustrated). In the implantation of a p-type impurity, for example, boron (B) is used as the impurity, the acceleration energy is set to 3 keV to 6 keV, the dose is set to be in a range from $0.4\times10^{13}/cm^2$ to $1\times10^{13}/cm^2$, and the implantation is performed from 4 directions at a tilt angle of 20° to 30°.

The pocket region is formed deeper than the extension region 26. As the impurity for the extension region 26, phosphorous (P) may also be used, and as the impurity for the pocket region, indium (In) may also be used. In addition, the extension implantation and the pocket implantation may be performed under different conditions for individual nMOSFET active regions. In addition, a co-implantation technique using nitrogen (N) and germanium (Ge) may also be used.

The resist pattern covering the first active region 12 is removed, and the second active region 13 is covered with a resist pattern. A p-type impurity is implanted into the first active region 12 using the first gate electrodes 21 and the first sidewall spacers 24 as masks, so that extension regions 25 are formed. In the implantation of a p-type impurity, for example, boron (B) is used as the impurity, the acceleration energy is set to 0.5 keV, and the dose is set to be in a range from $1\times10^{15}/cm^2$ to $2\times10^{15}/cm^2$.

Furthermore, an n-type impurity is implanted to form pocket regions (not illustrated). In the implantation of an n-type impurity, for example, arsenic (As) is used as the impurity, the acceleration energy is set to 25 keV to 40 keV, the dose is set to be in a range from $0.4\times10^{13}/cm^2$ to $1\times10^{13}/cm^2$, and the implantation is performed from 4 directions at a tilt angle of 20° to 30°.

The pocket region is formed deeper than the extension region 25. As the impurity for the pocket region, antimony (Sb) may also be used. In addition, the extension implantation and the pocket implantation may be performed under different conditions for individual pMOSFET active regions.

The sidewall spacers 24 have a function to offset the extension regions 25 and 26 and the pocket regions from the channel regions. When the offset is not required, the first sidewall spacers 24 may not be formed.

Figure 1G:
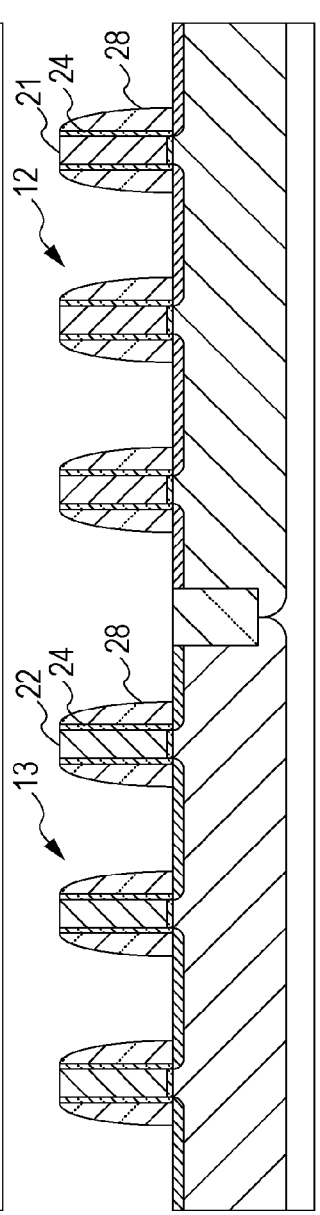

As illustrated in FIG. 1G, second sidewall spacers 28 of silicon on/nitride (SiON) are formed on the side surfaces of the first gate electrodes 21 and the side surfaces of the second gate electrodes 22 with the first sidewall spacers 24 interposed therebetween. Hereinafter, a method for forming the second sidewall spacers 28 will be described.

A SiON film or the like having a thickness of 20 to 40 nm is formed by LPCVD at a low film forming temperature of 600° C. or less. This SiON film is anisotropically etch-backed by RIE to remove the SiON film on the flat surfaces, so that the second sidewall spacers 28 remain on the side surfaces of the first and the second gate electrodes 21 and 22. In addition, as the second sidewall spacers 28, silicon nitride (SiN) may also be used. A SiN film may be formed by atomic layer deposition (ALD). SiN has a high etching resistance against hydrofluoric acid as compared to that of SiON. Hence, when SiN is used for the second sidewall spacers 28, a decrease in film thickness caused by a wet treatment using hydrofluoric acid may be suppressed.

Figure 1H:
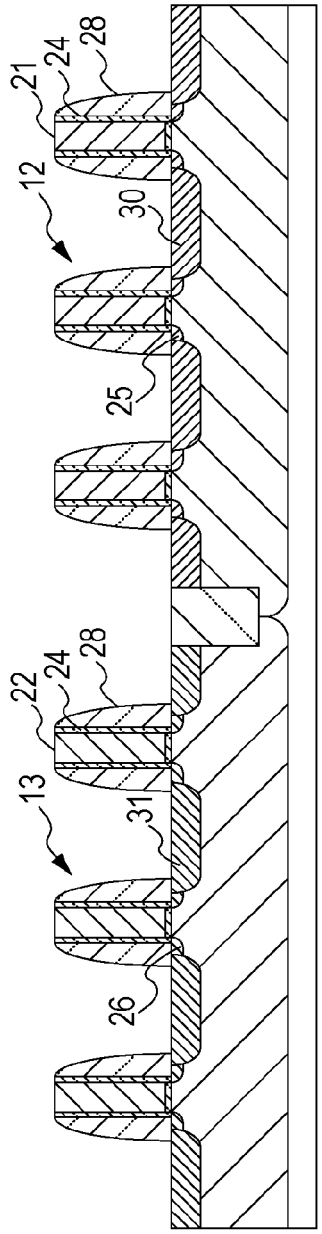

Subsequently, FIG. 1H will be described. The first active region 12 is covered with a resist pattern. An n-type impurity is implanted into a surface layer portion of the second active region 13 using the second gate electrodes 22, the first sidewall spacers 24, and the second sidewall spacers 28 as masks, so that buffer regions 31 are formed. In the implantation of an n-type impurity, for example, arsenic (As) is used as the impurity, the acceleration energy is set to 10 to 15 keV, and the dose is set to be in a range from $1\times10^{15}$ to $5\times10^{15}/cm^2$.

The resist pattern covering the first active region 12 is removed, and the second active region 13 is covered with a resist pattern. A p-type impurity is implanted into a surface layer portion of the first active region 12 using the first gate electrodes 21, the first sidewall spacers 24, and the second sidewall spacers 28 as masks, so that buffer regions 30 are formed. In the implantation of a p-type impurity, for example, boron (B) is used as the impurity, the acceleration energy is set to 10 to 15 keV, and the dose is set to be in a range from $1\times10^{15}$ to $5\times10^{15}/cm^2$.

The buffer region 30 formed in the first active region 12 is deeper than the extension region 25, and the buffer region 31 formed in the second active region 13 is deeper than the extension region 26. Subsequently, the resist pattern covering the second active region 13 is removed.

Figure 1I:
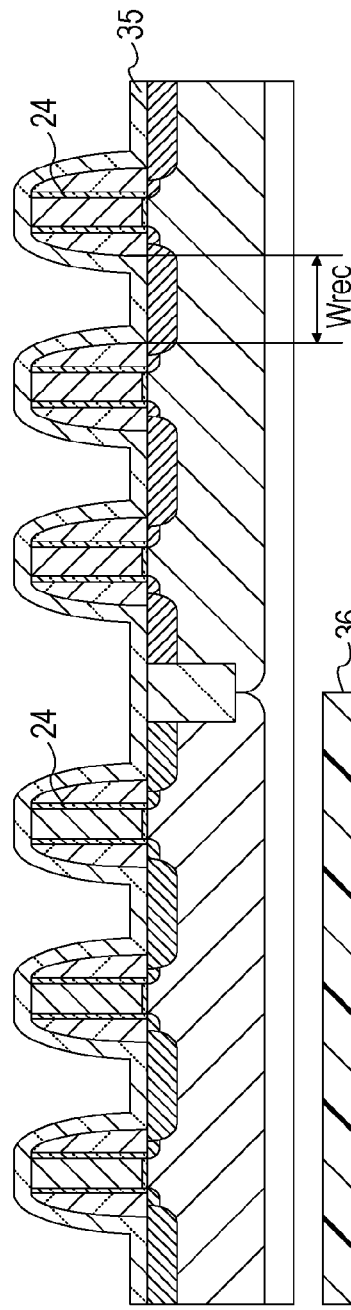

As illustrated in FIG. 1I, a first cap film 35 of a silicon oxide film or the like is formed. The cap film 35 is formed, for example, by LPCVD at a film forming temperature of 550° C. or less.

The thickness of the cap film 35 is controlled so that sections of the first cap film 35 formed on side surfaces facing each other on adjacent first gate electrodes 21 are not in direct contact with each other. For example, when a space Wrec between the bottom of second sidewall spacers 28 which are formed on the side surfaces facing each other on adjacent first gate electrodes 21 is 35 nm, the thickness of the first cap film 35 is set to 10 nm.

Figure 1J:
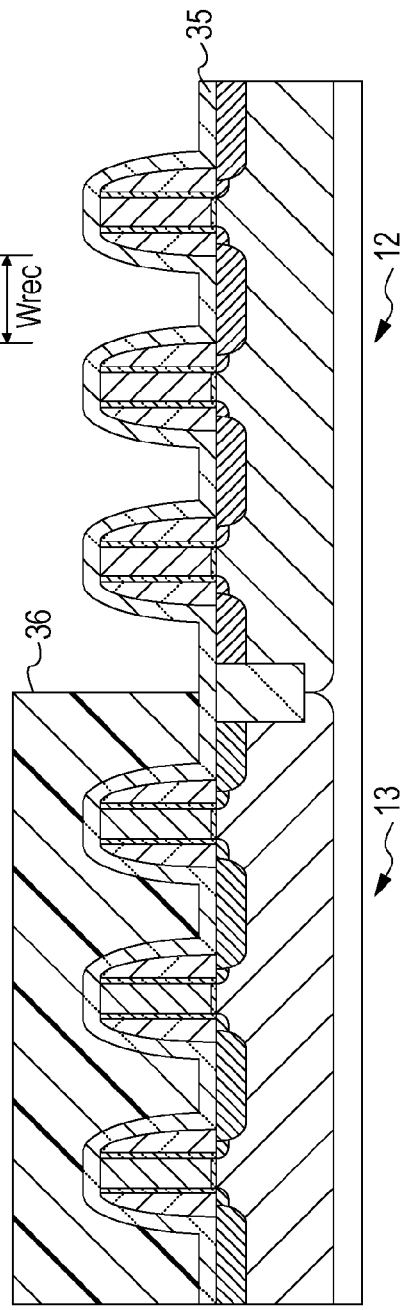

As illustrated in FIG. 1J, the first cap film 35 on the second active region 13 is covered with a first mask pattern 36 of a photoresist or the like.

Figure 1K:
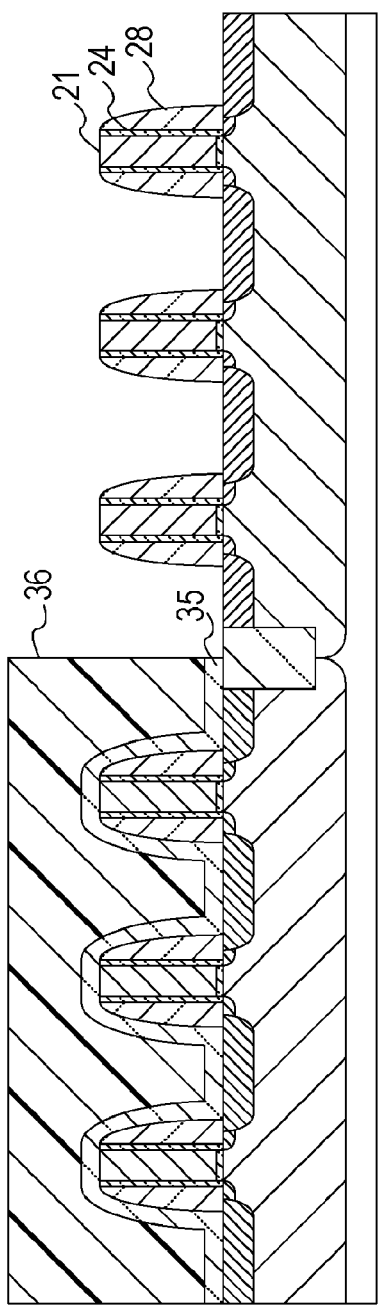

As illustrated in FIG. 1K, the first mask pattern 36 is used as an etching mask, and the first cap film 35 on the first active region 12 is etched off. In the etching of the first cap film 35, wet etching using hydrofluoric acid or the like or dry etching is used. In the case of dry etching, in order to remove the cap film on the side surfaces of the gate electrodes, isotropic etching conditions are preferably used. In addition, anisotropic etching conditions may also be appropriately used. Isotropic etching and anisotropic etching may be performed in combination, or dry etching and wet etching may also be performed in combination.

After the first cap film 35 is etched off, the first mask pattern 36 is removed. Since the second sidewall spacers 28 are formed of SiON or SiN, the etching resistance thereof against hydrofluoric acid is high as compared to that of silicon oxide.

Figure 1L:
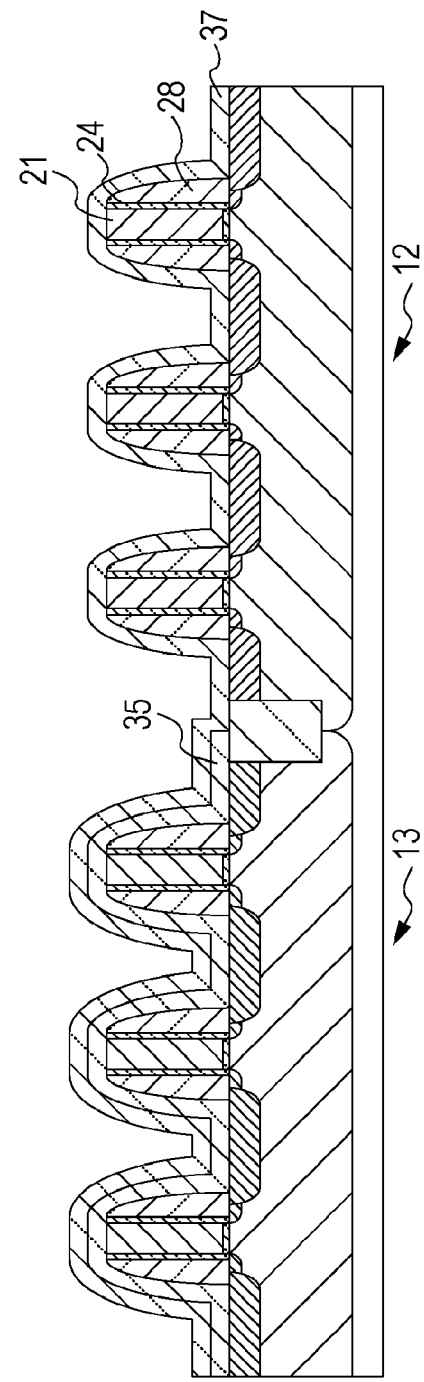

As illustrated in FIG. 1L, a second cap film 37 of silicon oxide or the like is formed. The second cap film 37 may be formed by the same method as that for the first cap film 35. As in the case of the first cap film 35, the thickness of the second cap film 37 is formed so that parts of the second cap film 37 on side surfaces facing each other on adjacent first gate electrodes 21 are not in direct contact with each other.

The first active region 12 is covered with the second cap film 37, and the second active region 13 is covered with two layers being the first cap film 35 and the second cap film 37.

Figures 1M, 1N:
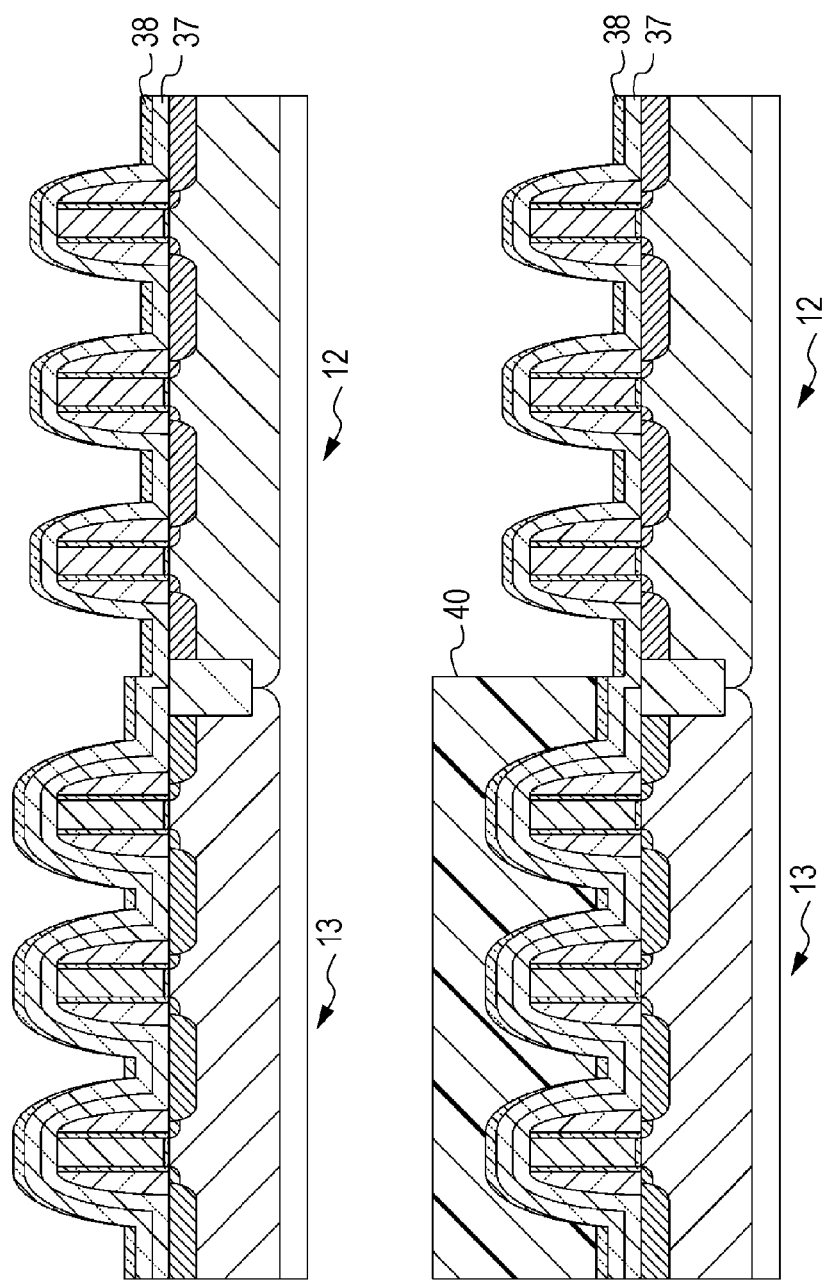

As illustrated in FIG. 1M, a third cap film 38 of silicon oxide or the like is formed, for example, by PECVD on the second cap film 37. Since the anisotropy of growth by PECVD is stronger than that by LPCVD, film formed on side surfaces is thinner than film formed on flat surfaces. The thickness of the third cap film 38 is set, for example, from 20 nm to 40 nm on the flat surface. With the presence of the third cap film 38, an effect to more reliably cover the second active region 13 may be obtained. When sufficient covering is performed by the first and the second cap films 35 and 37, the step of forming the third cap film 38 may be omitted. The degree of "sufficient covering" will be described later with reference to FIG. 5.

As illustrated in FIG. 1N, the third cap film 38 on the second active region 13 is covered with a second mask pattern 40 made of a photoresist.

Figures 1O, 1P:
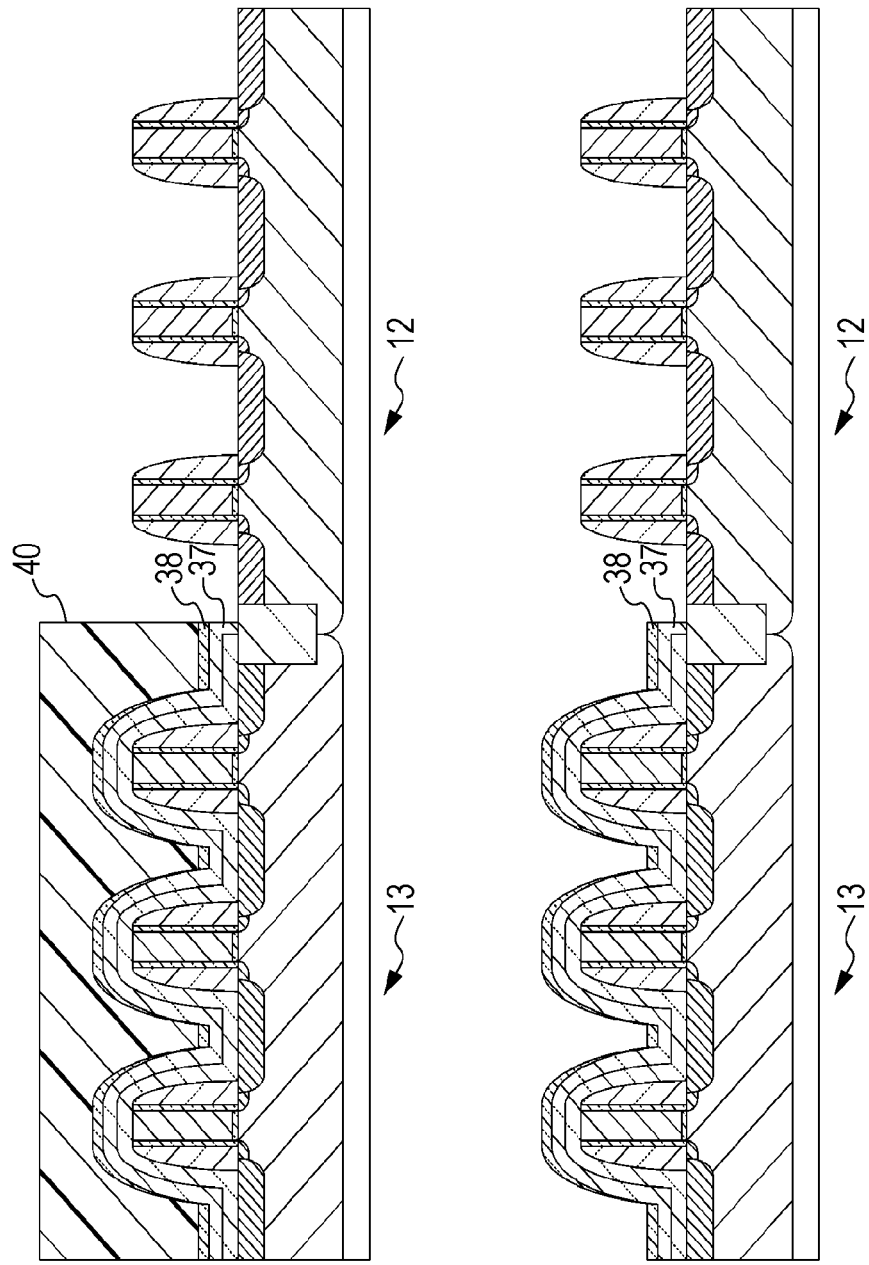

As illustrated in FIG. 1O, the second cap film 37 and the third cap film 38 on the first active region 12 are removed by etching using the second mask pattern 40 as an etching mask. The second cap film 37 and the third cap film 38 may be removed by RIE. In addition, the removal may be performed by a wet treatment using hydrofluoric acid.

As illustrated in FIG. 1P, the second mask pattern 40 is removed.

As illustrated in FIG. 1Q, concave portions 41 are formed in the first active region 12 by etching a surface layer portion of the semiconductor substrate 10 using the first gate electrodes 21 and the first and the second sidewall spacers 24 and 28 as masks. In this step, the first gate electrodes 21 are partially etched on the upper surfaces thereof, so that the upper surface of each first gate electrode 21 is located lower than the upper ends of the first and the second sidewall spacers 24 and 28.

Since the second active region 13 is covered with the first to the third cap films 35, 37, and 38, no concave portions are formed in the second active region 13. When the semiconductor substrate 10 is etched, anisotropic RIE or isotropic RIE may be used, or anisotropic dry etching and isotropic dry etching may be used in combination.

Anisotropic wet etching is performed inside the concave portion 41 using an etchant which contains an organic alkali such as tetramethylammonium hydroxide (TMAH). When TMAH is used, etching proceeds so that the (111) plane of silicon is exposed on the side surface of the concave portion 41. As a result, the side surface of the concave portion 41 is excavated below the edge of the second sidewall spacer 28. In addition, isotropic wet etching may also be performed using an ammonia hydroxide/hydrogen peroxide/water mixture as an etchant or an etchant containing inorganic alkali, such as ammonia-added hydrogen water, or anisotropic wet etching and isotropic wet etching may also be used in combination.

As illustrated in FIG. 1R, the concave portion 41 is filled with a filling member 43 made of SiGe or the like. Hereinafter, a method for forming the filling member 43 will be described.

First, the silicon surface inside the concave portion 41 is etched by dry etching. By this dry etching, a native oxide film and/or an adhering organic material on the silicon surface is removed. CVD is performed under the conditions in which no SiGe grows on the insulating film but SiGe grows only on the silicon surface. As the growth conditions of SiGe, for example, the grow temperature is set to 450 to 750° C.; $SiH_4$, $GeH_4$, $B_2H_6$, HCl, and $H_2$ are used as starting materials; the thickness is set in a range of 30 to 100 nm; and the Ge concentration is set to a range of 10 to 35 atomic percent.

As a result, the concave portion 41 is filled with the filling member 43 made of SiGe, and in addition, a filling member 44 is also formed on the first gate electrode 21. The filling member 43 grows in conformity with the crystal structure of the semiconductor substrate 10 and forms a single crystal. Since the first gate electrode 21 is formed of polysilicon, the filling member 44 thereon is formed to have a polycrystalline structure. As a starting material of silicon for selective growth of SiGe and Si, dichlorosilane ($SiH_2Cl_2$) or trichlorosilane ($SiHCl_3$) may be used instead of $SiH_4$. In addition, as a starting material of boron (B) functioning as a p-type dopant, $BCl_3$ may be used instead of $B_2H_6$.

The lattice constant of SiGe is larger than that of Si. Hence, the filling member 43 applies a compressive stress to the channel region under the first gate electrode 21 in an in-plane direction. In FIG. 1Q, the reason the concave portion 41 is expanded in the lateral direction is to efficiently apply a compressive stress to the channel region. However, a step of expanding the concave portion 41 in the lateral direction is not always required.

After the filling members 43 and 44 are formed, an etching treatment may be performed to remove SiGe adhering to the insulating film. In addition, C, which belongs to Group IV including Si and Ge, may also be added to SiGe. In addition, the composition distribution may be formed so that the Ge concentration changes in a film thickness direction.

Figure 1S:
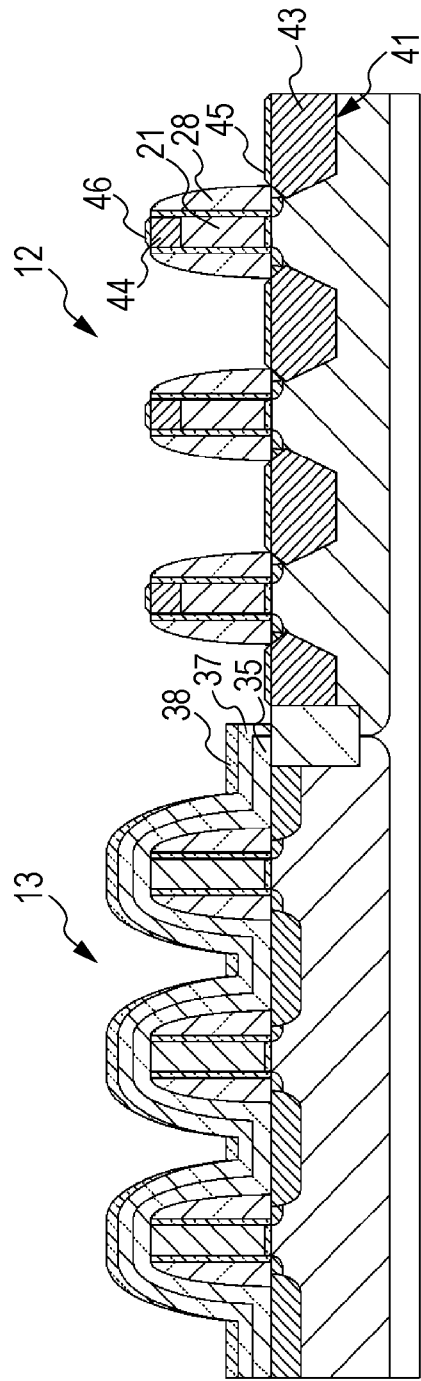

As illustrated in FIG. 1S, silicon layers 45 and 46 are selectively grown on the filling members 43 and 44, respectively, by CVD. As the growth conditions of the silicon layers, for example, the growth temperature is set to 450 to 750° C.; $SiH_4$, $B_2H_6$, HCl, and $H_2$ are used as starting materials; and the thickness is set to 30 nm or less.

Figure 1T:
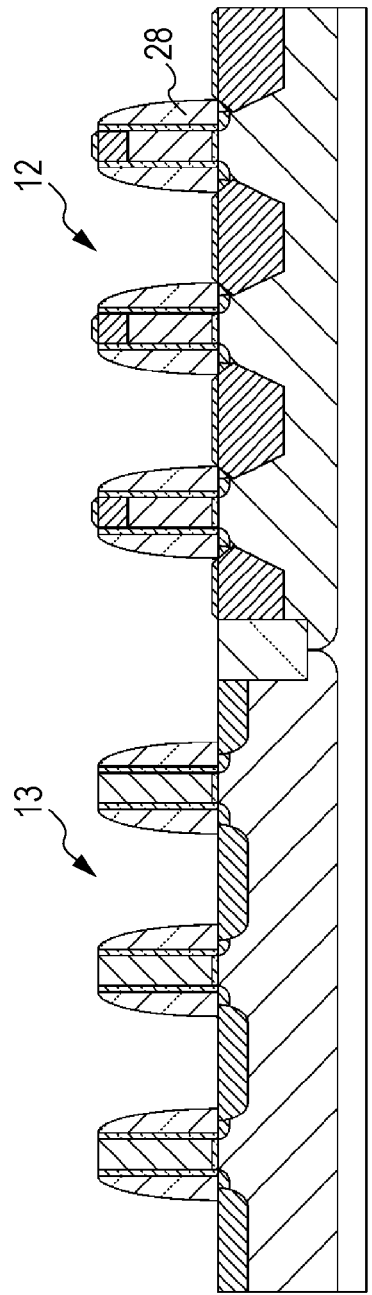

As illustrated in FIG. 1T, the first to the third cap films 35, 37, and 38 on the second active region 13 are removed by a wet treatment using hydrofluoric acid. In addition, since being formed of SiON or SiN, the second sidewall spacers 28 on the first active region 12 have a high etching resistance against hydrofluoric acid.

As illustrated in FIG. 1U, third sidewall spacers 48 of silicon oxide or the like are formed which cover the side surfaces of the first gate electrodes 21 and the side surfaces of the second gate electrodes 22. Hereinafter, a method for forming the third sidewall spacers 48 will be described.

A silicon oxide film having a thickness of 50 nm is deposited at 550° C. by LPCVD. This silicon oxide film is etch-backed by anisotropic RIE. As a result, the third sidewall spacers 48 remain only on the side surfaces of the first and the second gate electrodes 21 and 22.

As illustrated in FIG. 1V, a third mask pattern 50 of a photoresist material or the like is formed on the first active region 12. An n-type impurity is implanted into the surface layer portion of the second active region 13 using the second gate electrodes 22 and the first to the third sidewall spacers 24, 28, and 48 as masks, so that deep source-and-drain regions 53 are formed. In the implantation of an n-type impurity, for example, phosphorous (P) is used as the impurity, the acceleration energy is set to 5 to 10 keV, and the dose is set to be in a range of $1\times10^{15}$ to $5\times10^{15}/cm^2$.

In the first active region 12, the p-type filling members 43 function as a stressor to apply a stress to the channel region and as a source and a drain of each pMOSFET. The offset between the first gate electrode 21 and the filling member 43 is primarily determined by the thickness of the second sidewall spacer 28. On the other hand, the offset between the second gate electrode 22 and the source-and-drain region 53 is determined by the total thickness of the second and the third sidewall spacers 28 and 48. Hence, the offset between the second gate electrode 22 and the source-and-drain region 53 may be determined independently from the offset between the first gate electrode 21 and the filling member 43.

After the third mask pattern 50 is removed, in order to activate the impurity, spike rapid thermal annealing (RTA) is performed, for example, at a temperature of 1,050° C. In addition, in order to increase an activation rate of the impurity and also to prevent abnormal diffusion thereof, flash lamp annealing or laser spike annealing may also be performed at a temperature of 1,150° C. or more for approximately several milliseconds.

After the impurity is activated, the third sidewall spacers 48 are removed by a wet treatment using hydrofluoric acid or the like.

As illustrated in FIG. 1W, metal silicide films 55 of NiSi or the like are formed. In the first active region 12, the filling member 43 and 44 formed in the step illustrated in FIG. 1S are metal silicided, so that the metal silicide films 55 are formed. In the second active region 13, the metal silicide films 55 are formed on the source-and-drain regions 53, the buffer regions 31, and the exposed surfaces of the second gate electrodes 22.

As illustrated in FIG. 1X, a tensile stress film 58 having a tensile strain in an in-plane direction is formed on the second active region 13. Hereinafter, a method for forming the tensile stress film 58 will be described.

A silicon nitride film is formed by PECVD. The thickness of this silicon nitride film is set to 30 to 100 nm. The silicon nitride film on the second active region 13 is covered with a resist pattern. The silicon nitride film on the first active region 12 is removed by RIE using this resist pattern as an etching mask. Subsequently, the resist pattern is removed. As a result, the tensile stress film 58 of silicon nitride is formed on the second active region 13.

The tensile stress film 58 generates a tensile strain in the channel region under the second gate electrode 22 of each nMOSFET in an in-plane direction. Accordingly, the mobility of electrons in the channel region is improved.

As illustrated in FIG. 1Y, a compressive stress film 57 having a compressive strain in an in-plane direction is formed on the first active region 12. Hereinafter, a method for forming the compressive stress film 57 will be described.

A silicon nitride film is formed by PECVD. The thickness of this silicon nitride film is set to 30 to 100 nm. The silicon nitride film on the first active region 12 is covered with a resist pattern. The silicon nitride film on the second active region 13 is removed by RIE using this resist pattern as an etching mask. Subsequently, the resist pattern is removed. As a result, the compressive stress film 57 of silicon nitride is formed on the first active region 12.

The compressive stress film 57 generates a compressive strain in the channel region under the first gate electrode 21 of each pMOSFET in an in-plane direction. Since a compressive strain is generated in the channel region by the filling member 43 and the compressive stress film 57, the mobility of holes in the channel region may be improved.

As illustrated in FIG. 1Z, an interlayer insulating film 60 having a thickness of 0.5 μm to 0.7 μm is formed on the compressive stress film 57 and the tensile stress film 58. The interlayer insulating film 60 may be formed, for example, by CVD using $O_2$ and TEOS as starting materials. The surface of the interlayer insulating film 60 is planarized by chemical mechanical polishing (CMP). Contact holes are formed in this interlayer insulating film 60 and are then filled with conductive plugs 61 made of tungsten (W) or the like. In addition, the inside surface of the contact hole is covered with a diffusion barrier layer having a two-layer structure composed, for example, of TiN and Ti.

With reference to FIGS. 2A to 2C, comparative example 1 will be described.

A process including a step of forming the first cap film 35 illustrated in FIG. 2A and the preceding steps is the same as that illustrated in FIGS. 1A to 1I of the embodiment. In the manufacturing method illustrated in FIGS. 1A to 1V, the second and the third cap films 37 and 38 are formed; however, in the comparative example 1, the second and the third cap films 37 and 38 are not formed. The first cap film 35 has a thickness smaller than the total of the thicknesses of the first to the third cap films 35, 37, and 38. Hence, covering defects are liable to occur. In FIG. 2A, a covering defect 71 is generated on the surface of the semiconductor substrate 10 in the second active region 13, and a covering defect 72 is generated at a shoulder portion of the second gate electrode 22.

As illustrated in FIG. 2B, when the concave portions 41 are formed in the surface layer portion of the first active region 12, the semiconductor substrate 10 at the covering defect 71 is also etched, and a concave portion 73 is formed. In addition, the second gate electrode 22 at the covering defect 72 is also etched, and a cavity 74 is formed. The generation of this cavity 74 was actually observed by a scanning electron microscope (SEM).

As illustrated in FIG. 2C, in selective growth of SiGe, SiGe is also grown in the concave portion 73 and the cavity 74 formed in the second active region 13, and unnecessary SiGe members 75 and 76 are formed. The SiGe members 75 and 76 cause a decrease in yield of nMOSFETs and degradation in performance thereof.

In the manufacturing method illustrated in FIGS. 1A to 1V, when the concave portions 41 are formed, and when SiGe is selectively grown, the second active region 13 is covered with the first cap film 35 and with the second and the third cap films 37 and 38. Hence, the generation of covering defects may be suppressed.

With reference to FIGS. 3A to 3B, comparative example 2 will be described. A process including a step of forming a first cap film 35A illustrated in FIG. 3A and preceding steps is the same as that illustrated in FIGS. 1A to 1I of the embodiment. However, in the comparative example 2, the first cap film 35A is designed to have a thickness approximately equivalent to the total thickness of the first to the third cap films 35, 37, and 38. Since the thickness of the first cap film 35A is large, the covering defects illustrated in FIG. 2A of the comparative example 1 are not likely to occur.

However, parts of the first cap film 35A formed on side surfaces facing each other on adjacent first gate electrodes 21 may be in direct contact with each other in some cases. When the above parts of the first cap film 35A are in direct contact with each other, the thickness of the first cap film 35A deposited on each of the flat surfaces between the first gate electrodes 21 becomes larger than a targeted thickness. As illustrated in FIG. 3A, the first cap film 35A deposited on the flat surface of each of space portions 80 between the first gate electrodes 21 is larger than the targeted thickness.

As illustrated in FIG. 3B, the first cap film 35A on the second active region 13 is covered with a first mask pattern 36A. The first cap film 35A on the first active region 12 is removed by etching using the first mask pattern 36A as an etching mask. Since the thickness of the first cap film 35A on the flat surface of the space portion 80 is larger than the targeted thickness, an etching residue 81 is liable to remain on this portion.

Figure 3C:
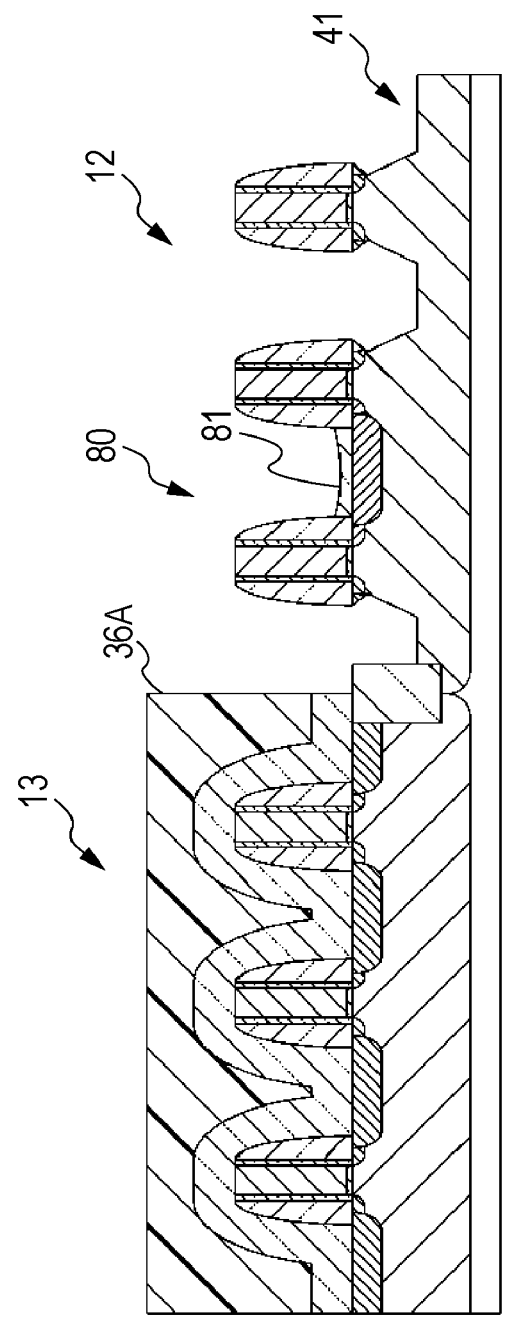

As illustrated in FIG. 3C, the surface layer portion of the first active region 12 is etched, so that the concave portions 41 are formed. At the portion on which the etching residue 81 remains, the etching residue 81 functions as an etching mask, and hence no concave portions are formed.

In the manufacturing method illustrated in FIGS. 1A to 1V, the first cap film 35 is etched off in the step illustrated in FIG. 1K, and, in the step illustrated in FIG. 1O, the second and the third cap films 37 and 38 are etched off. Since the first cap film 35 used in the embodiment is thinner than the first cap film 35A used in the comparative example 2, an etching residue is not likely to remain. In addition, when the second and the third cap films 37 and 38 are formed, the first cap film 35 on the first active region 12 is already removed. Hence, a cap film having a thickness larger than the targeted thickness may not be formed on the flat surface of the space portion between the first gate electrodes 21.

Figure 4:
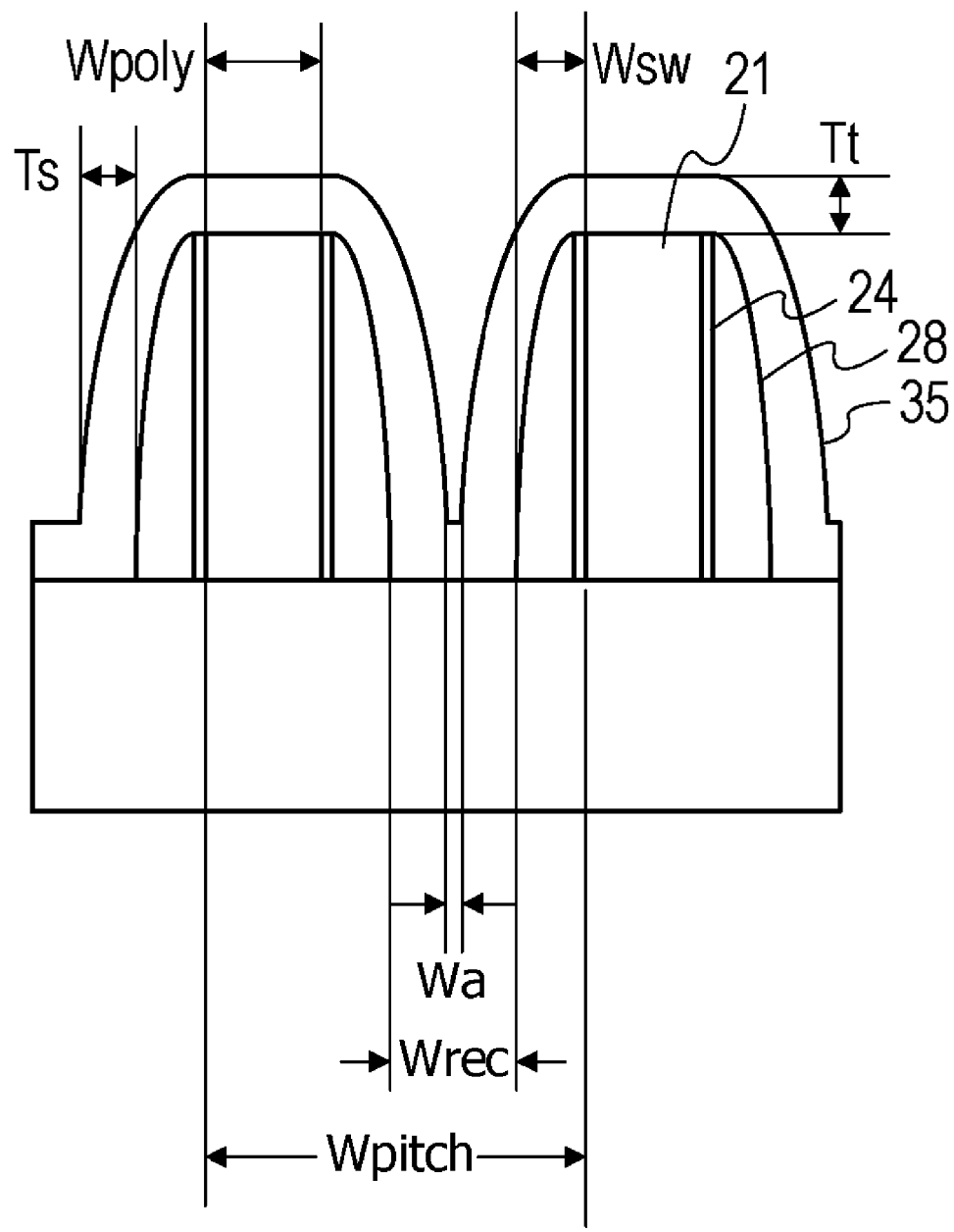
FIG. 4 illustrates a cross-sectional view of a gate electrode.

With reference to FIG. 4, the upper limit of a preferable range of the thickness of the first cap film 35 will be described. The upper limit of a preferable range of the thickness of the second cap film 37 is the same as the upper limit of the preferable range of the thickness of the first cap film 35.

A pitch of the first gate electrodes 21 in the channel length direction (moving direction of carriers) is represented by Wpitch. The total maximum thickness of the first sidewall spacer 24 and the second sidewall spacer 28 is represented by Wsw. The gate length of each first gate electrode 21 is represented by Wpoly. In a region between second sidewall spacers 28 formed on side surfaces facing each other on adjacent first gate electrodes 21, the space at the narrowest portion is represented by Wrec. The space Wrec is represented by the following equation:

$$Wrec = Wpitch - Wpoly - 2Wsw.$$

The thickness of the first cap film 35 deposited on the side surface of the first gate electrode 21 is represented by Ts. The narrowest space Wa between parts of the first cap film 35 deposited on the side surfaces facing each other of the adjacent first gate electrodes 21 is represented by Wa=Wrec−2Ts.

When the space Wa has a positive value, the thickness of the first cap film 35 on the flat surface between the adjacent first gate electrodes 21 is approximately equivalent to thickness Tt on the first gate electrode 21. When the space Wa has a negative value, that is, when the parts of the first cap film 35 deposited on the side surfaces facing each other on the adjacent first gate electrodes 21 are in direct contact with each other as in the case of the first cap film 35A on the space portion 80 illustrated in FIG. 3A, the thickness of the first cap film 35 on the flat surface of the space portion becomes larger than the thickness Tt. In this case, as illustrated in FIG. 3B, the etching residue 81 is liable to remain.

In consideration of over-etching performed in anisotropic etching of the first cap film 35, the first cap film 35 is preferably formed so that the thickness of the first cap film 35 formed on the semiconductor substrate 10 between the adjacent first gate electrodes 21 is smaller than the thickness Tt of the first cap film 35 on the first gate electrode 21.

Figure 5:
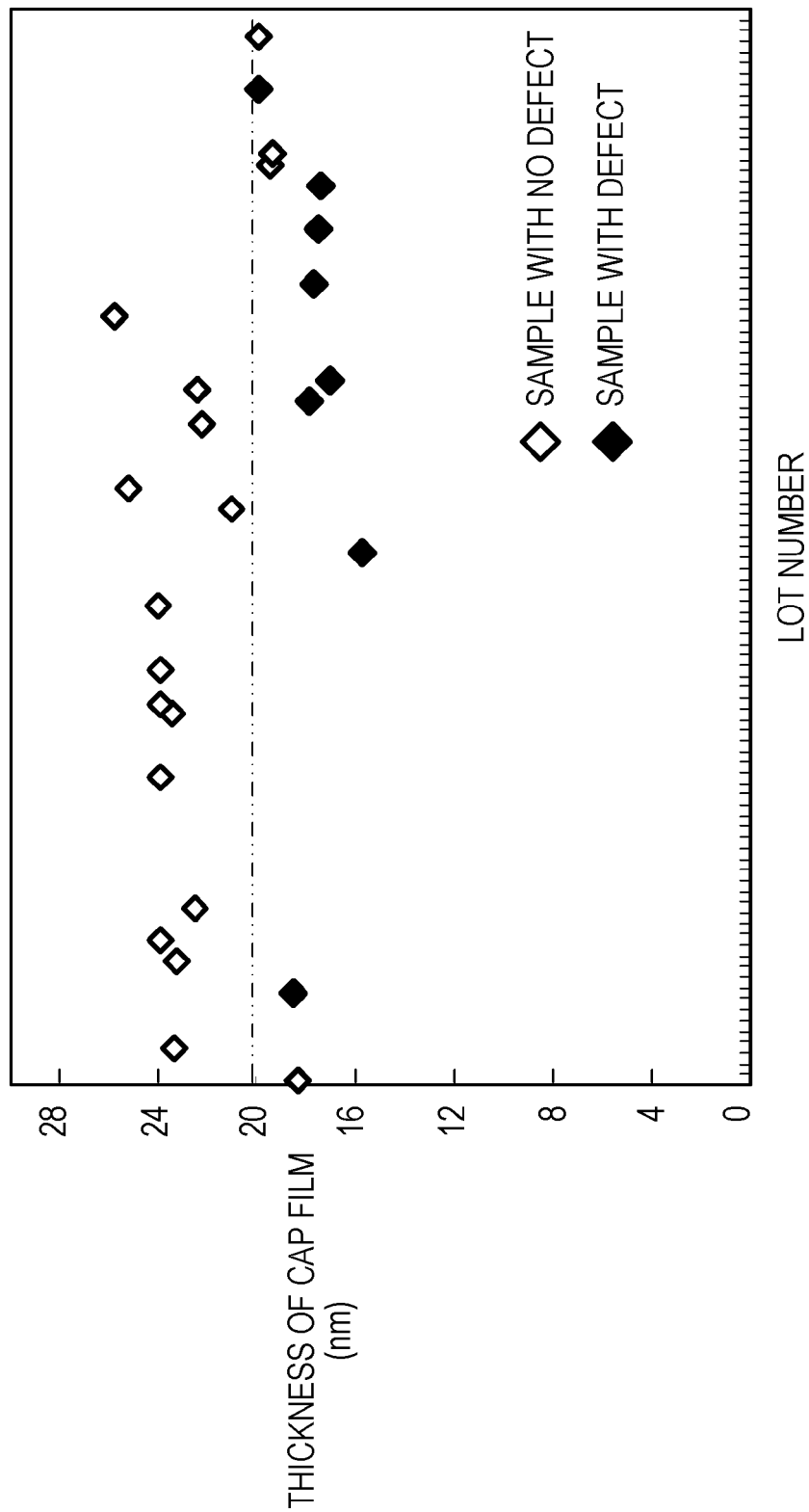
FIG. 5 illustrates results of defect detecting of a semiconductor device.

With reference to FIG. 5, the lower limit of a preferable range of the total thickness of the first cap film 35 and the second cap film 37 will be described.

Evaluation samples having different total thicknesses of the first cap film 35 and the second cap film 37 illustrated in FIG. 1P were formed, and the concave portions 41 illustrated in FIG. 1Q were formed. In each evaluation sample, the third cap film 38 was not formed. In each sample, the presence of defects corresponding to the concave portion 73 and the cavity 74 illustrated in FIG. 2B was observed.

The observation results are illustrated in FIG. 5. The horizontal axis indicates the lot number of the sample, and the vertical axis indicates the total thickness in nanometers of the first and the second cap films 35 and 37. Three wafers per one lot were sampled, and the presence or absence of the defects was observed. The total thickness of the first and the second cap films 35 and 37 was measured in a sufficiently wide and flat area after the filling members 43 illustrated in FIG. 1R were formed. It is believed that the total thickness of the first and the second cap films 35 and 37 is approximately equivalent to the thickness on the upper surface of the second gate electrode 22.

The lot in which no defects were observed is illustrated by an outline mark, and the lot in which at least one defect was observed is illustrated by a black mark. In samples in which the total thickness of the first and the second cap films 35 and 37 was set to 20 nm or more, it was found that no defects were observed. It was also found that defects were frequently observed in samples in which the total thickness of the first and the second cap films 35 and 37 was set to less than 20 nm. From the results described above, it is believed that after the concave portions 41 illustrated in FIG. 1Q are formed, the process conditions are preferably set so that the total thickness of the first and the second cap films 35 and 37 on the second active region 13 is 20 nm or more.

The first and the second cap films 35 and 37 undergo various cleaning and etching steps from after the formation thereof to the formation of the concave portions 41, and as a result, the thicknesses of the first and the second cap films 35 and 37 are decreased. This decrease in thickness is believed to be approximately 10 nm. In consideration of this decrease in thickness, the total thickness of the first and the second cap films 35 and 37 after the formation thereof is preferably set to 30 nm or more. In this embodiment, the "thickness" indicates the thickness on the upper surface of the second gate electrode 22.

In addition, as illustrated in FIG. 1M, the third cap film 38 is formed. Hence, the lower limit of the preferable conditions of the total thickness of the first and the second cap films 35 and 37 is decreased. The first to the third cap films 35, 37, and 38 may have a total thickness of 30 nm or more right the formation thereof.

In the step illustrated in FIG. 1T, the first, the second, and the third cap films 35, 37, and 38 on the second active region 13 are removed. However, at this stage, the first to the third cap films 35, 37, and 38 may not be totally removed. In the case in which the offset of the deep source-and-drain region 53 illustrated in FIG. 1V may be sufficiently precisely controlled, the first, the second, and the third cap films 35, 37, and 38 may partially remain. The partially remaining cap films may be removed in the step in which the third sidewall spacers 48 illustrated in FIG. 1V are removed.

In the manufacturing method illustrated in FIGS. 1A to 1T, silicon is used for the semiconductor substrate 10, and SiGe is used for the filling members 43 formed in the step illustrated in FIG. 1R. The combination of these materials is one example, and other combinations may also be used. In general, for the filling member 43, a semiconductor material may be used which has a lattice constant different from that of the semiconductor substrate 10 and which grows epitaxially on the surface thereof. The magnitude of the lattice constant depends on whether a stress to be applied to the channel region is a compressive stress or a tensile stress.

In the manufacturing method illustrated in FIGS. 1A to 1T, the case in which the gate electrodes intersect with one active region is described. In the case in which only one gate electrode intersects with one active region, a phenomenon in which the etching residue 81 remains on the space portion 80 between the gate electrodes as illustrated in FIGS. 3A to 3C is not generated. Hereinafter, the effect obtained when only one gate electrode intersects with one active region will be described.

When the thickness of the first cap film 35A is increased as illustrated in FIG. 3A, in the etching step illustrated in FIG. 3B, the thick cap film 35A is preferably be etched using the first mask pattern 36A as an etching mask. When the first cap film 35A is etched using hydrofluoric acid, if the etching takes a long period of time, hydrofluoric acid may infiltrate into the first mask pattern 36A of a photoresist or the like, and as a result, a sufficient mask function may not be obtained in some cases.

As in the manufacturing method illustrated in FIGS. 1A to 1T, when the cap film is formed from at least two layers, such as the first cap film 35 and the second cap film 37, and etching steps thereof are respectively performed using different mask patterns, the etching time per one step may be decreased. Hence, while a sufficient mask function is maintained, the cap films may be reproducibly removed.

Figure 6:
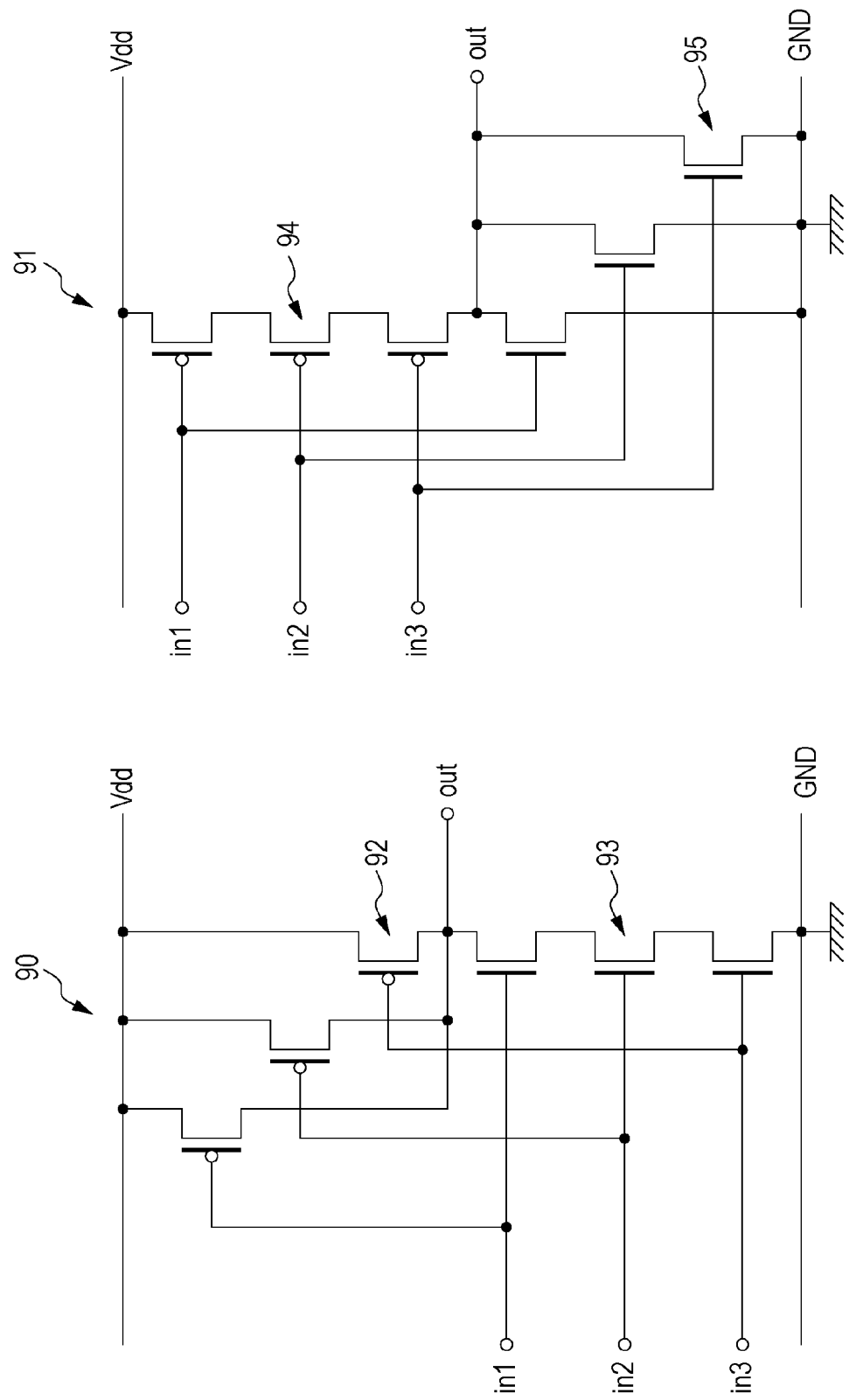
FIG. 6 is an equivalent circuit diagram of a logic circuit applied to the semiconductor device according to an embodiment.

FIG. 6 illustrates one example of a logic circuit which uses a semiconductor device manufactured by the manufacturing method illustrated in FIGS. 1A to 1T. In this example, a 3-input CMOS-NAND circuit 90 includes 3 pMOSFETs 92 and 3 nMOSFETs 93, and a 3-input CMOS-NOR circuit 91 includes 3 pMOSFETs 94 and 3 nMOSFETs 95. The 3 pMOSFETs 94 of the NOR circuit 91 correspond to the pMOSFETs in the first active region 12 for pMOSFETs illustrated in FIG. 1Z, and the 3 nMOSFETs 93 of the NAND circuit 90 correspond to the nMOSFETs in the second active region 13 for nMOSFETs illustrated in FIG. 1Z.

When the method of the above embodiment is applied to the formation of the CMOS-NAND circuit 90 and the CMOS-NOR circuit 91, a decrease in yield may be suppressed. In addition, in one pMOSFET active region, 2 pMOSFETs may be arranged, or at least 4 pMOSFETs may also be arranged.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention as set forth in the claims.

What is claimed is:
1. A method of manufacturing a semiconductor device, the method comprising:
   forming an insulating film in a semiconductor substrate to define a first active region and a second active region;
   forming a first gate electrode and a second gate electrode in the first active region;
   forming a third gate electrode and a fourth gate electrode in the second active region;
   forming, over the semiconductor substrate, a first cap film covering the first gate electrode, the second gate electrode, the third gate electrode, and the fourth gate electrode;
   forming a first mask pattern covering the first cap film over the second active region;
   etching the first cap film over the first active region using the first mask pattern as an etching mask;

after etching the first cap film, removing the first mask pattern;

after removing the first mask pattern, forming a second cap film over the semiconductor substrate;

forming a second mask pattern covering the second cap film over the second active region;

etching the second cap film over the first active region using the second mask pattern as an etching mask;

etching the first active region using the first gate electrode and the second gate electrode as masks to form a recess in the first active region;

embedding, in the recess, a semiconductor material having a first lattice constant different from a second lattice constant of the semiconductor substrate;

implanting an impurity into the second active region using the third gate electrode and the fourth gate electrode as masks; and forming a third cap film over the second cap film by plasma enhanced chemical vapor deposition after forming the second cap film, and before forming the second mask pattern.

2. The method of manufacturing a semiconductor device according to claim 1, wherein the semiconductor substrate includes a silicon crystal, the first active region is an n-type active region, the second active region is a p-type active region, and the semiconductor material includes Si and Ge.

3. The method of manufacturing a semiconductor device according to claim 1, wherein the first cap film and the second cap film are formed by thermal chemical vapor deposition.

4. The method of manufacturing a semiconductor device according to claim 1, further comprising:

forming sidewall spacers on side surfaces of the first gate electrode, the second gate electrode, the third gate electrode, and the fourth gate electrode after forming the first gate electrode, the second gate electrode, the third gate electrode, and the fourth gate electrode, and before forming the first cap film.

5. The method of manufacturing a semiconductor device according to claim 4, further comprising:

forming a silicon film over the semiconductor material, removing the first cap film and the second cap film over the second active region, and forming a metal silicide film over the first active region and the second active region, after forming the semiconductor material.

6. The method of manufacturing a semiconductor device according to claim 1, wherein a first thickness of the first cap film formed over the semiconductor substrate between the first gate electrode and the second gate electrode is smaller than a second thickness of the first cap film formed over the upper surface of the first gate electrode, and a third thickness of the second cap film over the semiconductor substrate between the first gate electrode and the second gate electrode is smaller than a fourth thickness of the second cap film formed over the upper surface of the first gate electrode.

7. A method of manufacturing a semiconductor device, the method comprising:

forming an insulating film in a semiconductor substrate to define a first active region and a second active region;

forming a first gate electrode in the first active region;

forming a second gate electrode in the second active region;

forming, over the semiconductor substrate, a first cap film covering the first gate electrode and the second gate electrode;

forming a first mask pattern covering the first cap film over the second active region;

etching the first cap film over the first active region using the first mask pattern as an etching mask;

after etching the first cap film, removing the first mask pattern;

after removing the first mask pattern, forming a second cap film over the semiconductor substrate;

forming a second mask pattern covering the second cap film over the second active region;

etching the second cap film over the first active region using the second mask pattern as an etching mask;

etching the semiconductor substrate using the first gate electrode as a mask to form concave portions in the first active region;

embedding, in the concave portions, a semiconductor material having a first lattice constant different from a second lattice constant of the semiconductor substrate;

implanting an impurity into the second active region using the second gate electrode as a mask; and forming a third cap film over the second cap film by plasma enhanced chemical vapor deposition after forming the second cap film, and before forming the second mask pattern.

* * * * *